United States Patent

Matsubara

[11] Patent Number: 6,157,273
[45] Date of Patent: *Dec. 5, 2000

[54] ROTATABLE DIRECTIONAL COUPLER WITH A TAP PLATE

[75] Inventor: Hiroshi Matsubara, Nisshin, Japan

[73] Assignee: Maspro Denkoh Co., Ltd., Aichi, Japan

[ * ] Notice: This patent is subject to a terminal disclaimer.

[21] Appl. No.: 09/011,914

[22] PCT Filed: Jun. 18, 1996

[86] PCT No.: PCT/JP96/01666

§ 371 Date: Mar. 31, 1999

§ 102(e) Date: Mar. 31, 1999

[87] PCT Pub. No.: WO97/49181

PCT Pub. Date: Dec. 24, 1997

[51] Int. Cl.[7] ........................................................ H01P 5/18
[52] U.S. Cl. ............................................. 333/109; 333/112
[58] Field of Search .................................... 333/100, 101, 333/105, 106, 112, 109

[56] References Cited

U.S. PATENT DOCUMENTS

| | | | |
|---|---|---|---|
| 4,963,966 | 10/1990 | Harney et al. | 380/52 X |
| 5,638,035 | 6/1997 | Romerein et al. | 333/101 |
| 5,675,300 | 10/1997 | Romerein | 333/100 |
| 5,990,759 | 11/1999 | Matsubara | 333/112 X |

FOREIGN PATENT DOCUMENTS 58-44612 10/1983 Japan .
62-44618 11/1987 Japan .

Primary Examiner—Justin P. Bettendorf
Attorney, Agent, or Firm—Pearson & Pearson, LLP; Walter F. Dawson

[57] ABSTRACT

A direction coupler makes it possible to freely select an input terminal and an output terminal thereof. A branch unit (6) containing a branching circuit (6a) is mounted so that the branch unit (6) can be rotated relative to a mother board (5), with a central portion of the branch unit (6) being a fulcrum. Relay terminals (11, 12, 13, 14) of the mother board (5) are provided at positions corresponding to an input terminal (15) and an output terminal (16) of the branch unit (6).

1 Claim, 5 Drawing Sheets

(a)
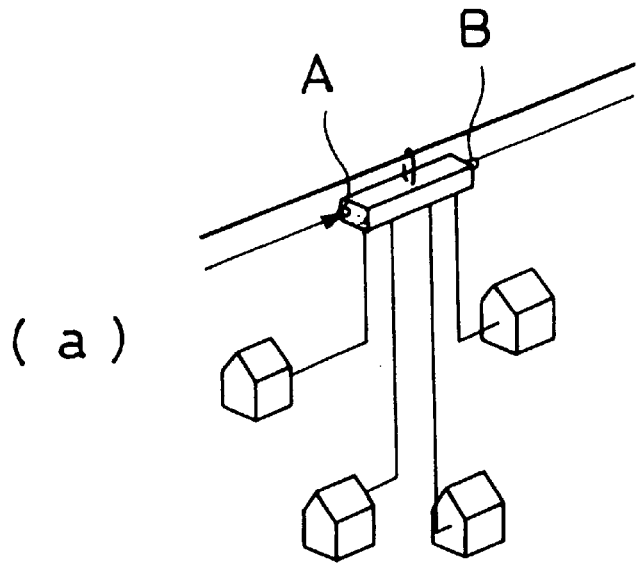
(PRIOR ART)
(b)
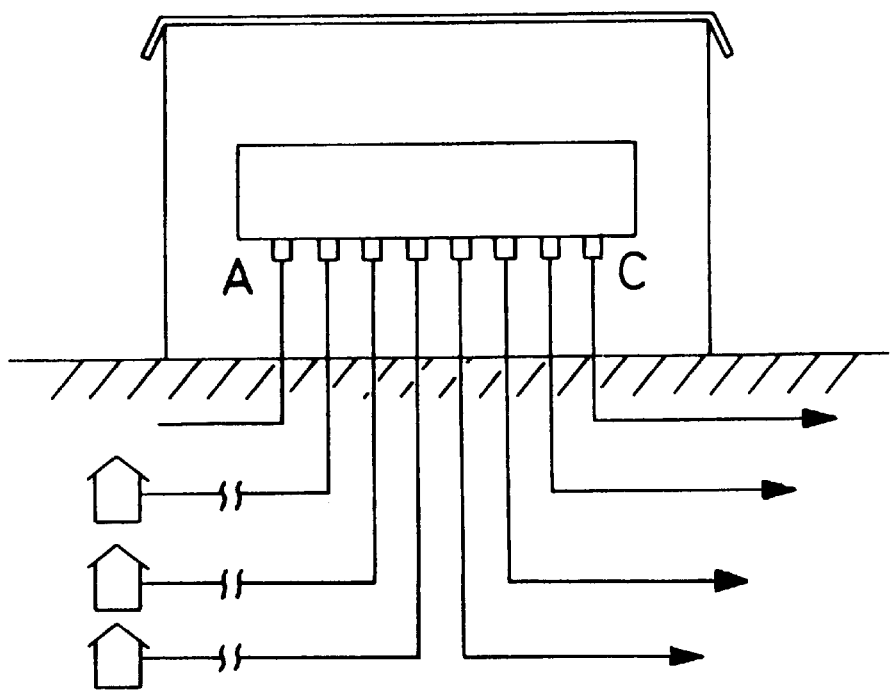
Figure 5 *(PRIOR ART)*

ROTATABLE DIRECTIONAL COUPLER WITH A TAP PLATE

DESCRIPTION

1. Technical Field

The present invention relates to direction couplers and, more particularly, to a direction coupler suitable for CATV.

2. Background Art

CATV cables are not always suspended in air but, in some cases, buried underground.

In addition, the number of branches (distributions) varies depending on the number of subscribers Therefore, a variety of direction couplers with different numbers of branches are presently produced. In an air-suspended type direction coupler as shown in FIG. 5a, a first terminal A, that is, an input terminal, and a second terminal B, that is, an output terminal, are provided in surfaces opposite to each other. In an underground-placed type direction coupler as shown in FIG. 5b, a first terminal A and a third terminal C, that is, input/output terminals, are provided in a single surface.

In present cable networks, changes from suspension to underground placement and, conversely, from underground placement to suspension are expectable. In such a case, an attempt to use the existing direction couplers results in a change in the direction of wiring and incompatibility in the position of the terminal-connecting portions, which impede the connecting of cables.

In cases where the cable connections are redone from the beginning, a change in the number of branches is often required as well.

DISCLOSURE OF THE INVENTION

According to the present invention, there is provided a direction coupler that can be changed from a suspended type to a buried type or the other way around. The direction coupler has a construction wherein a mother board having a current passing circuit, a branch unit having a branching circuit and a tap plate having a distributing circuit are housed in a cover body in which connecting portions for first and second terminals are provided in a side surface thereof and a connecting portion for a third terminal is provided in another surface thereof, and wherein the branch unit has input/output terminals, and is mounted so that the mounting manner of the branch unit can be selected from a plurality of mounting manner relative to the mother board, and wherein the mother board is provided with relay terminals which are connected at positions that match position patterns of the input/output terminals corresponding to the individual mounting manners of the branch unit, so that high frequency signals can be transmitted through two terminals of said A, B and C.

The high frequency signal herein includes a television signal, a control signal, and a communication modulated signal as in telephone.

The branching circuit may be supported to the mother board so that the branching circuit can be rotated along a surface of the mother board, with a central portion of the branching circuit as a fulcrum. A branch terminal of the branch unit may be provided at a position of a center of the rotation.

The position of the input/output terminals can be selected merely by changing the mounting manner of the branching circuit. The number of branch terminals or the amount of branching can be changed simply by replacing the entire units.

Furthermore, if the branching circuit is supported to the mother board so that the branching circuit can be rotated along a surface of the mother board, with a central portion thereof being as a fulcrum, and a branch terminal of the branch unit is provided at the position of a center of the rotation, then operability improves.

BRIEF DESCRIPTION OF THE DRAWINGS

FIGS. 5a and 5b illustrate examples of the conventional art.

BEST MODE FOR CARRYING OUT THE INVENTION

Figure 1:
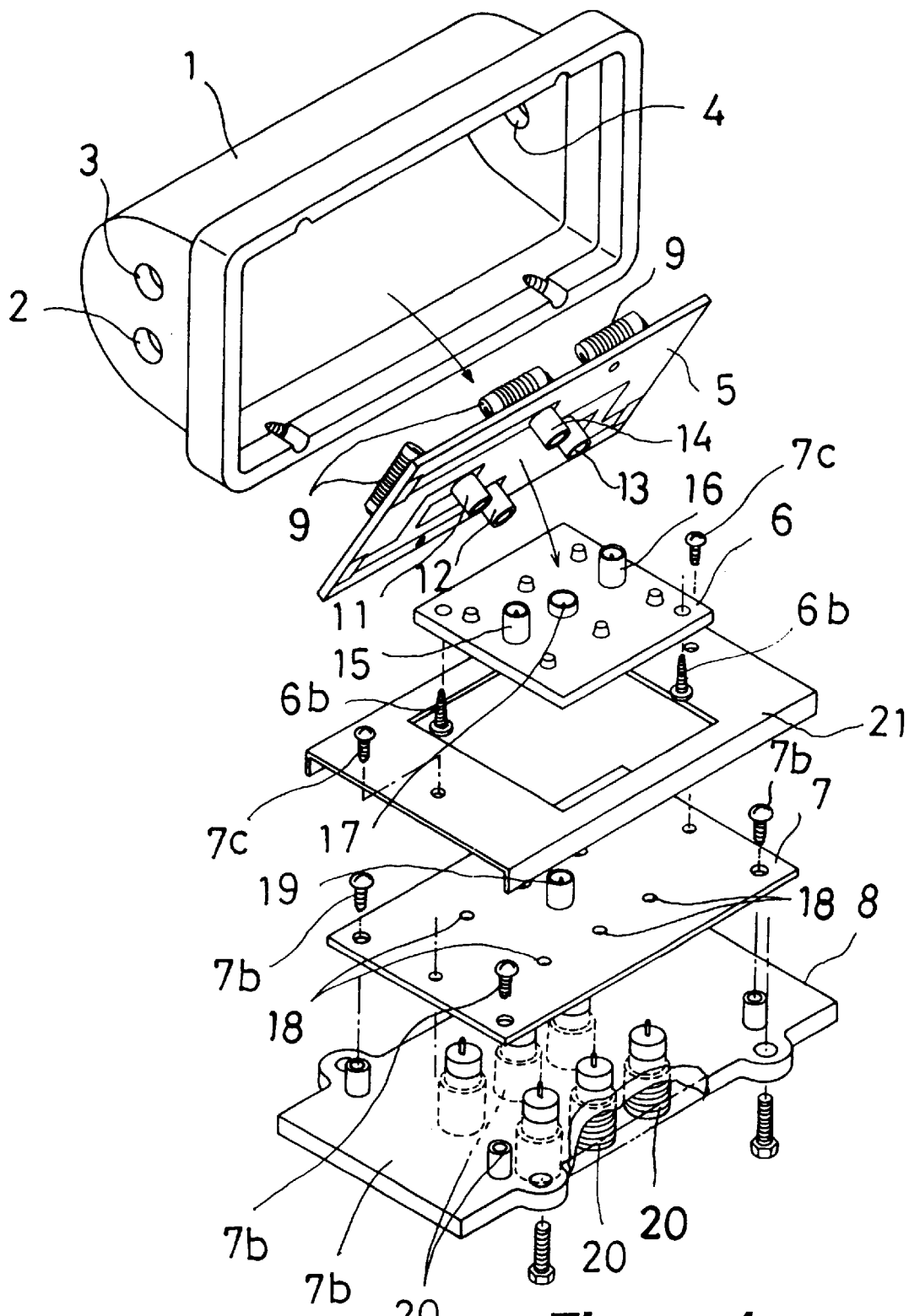
FIG. 1 is an exploded view illustrating an embodiment of the direction coupler of the present invention.

An embodiment of the direction coupler of the present invention will be described with reference to the drawings.

Reference numeral 1 represents a cover body having an opening at one side. The cover body 1 has cable insert holes 2, 3 that are formed as connecting portions for first and second terminals A, B in a side of the cover body 1, and a cable insert hole 4 that is formed as a connecting portion for a third terminal C in another side of the cover body 1. A mother board 5 and a branch unit 6 are housed inside the cover body 1. The opening side of the cover body 1 is closed by a lid body 8 to which a tap plate 7 is integrally attached.

Figure 2:
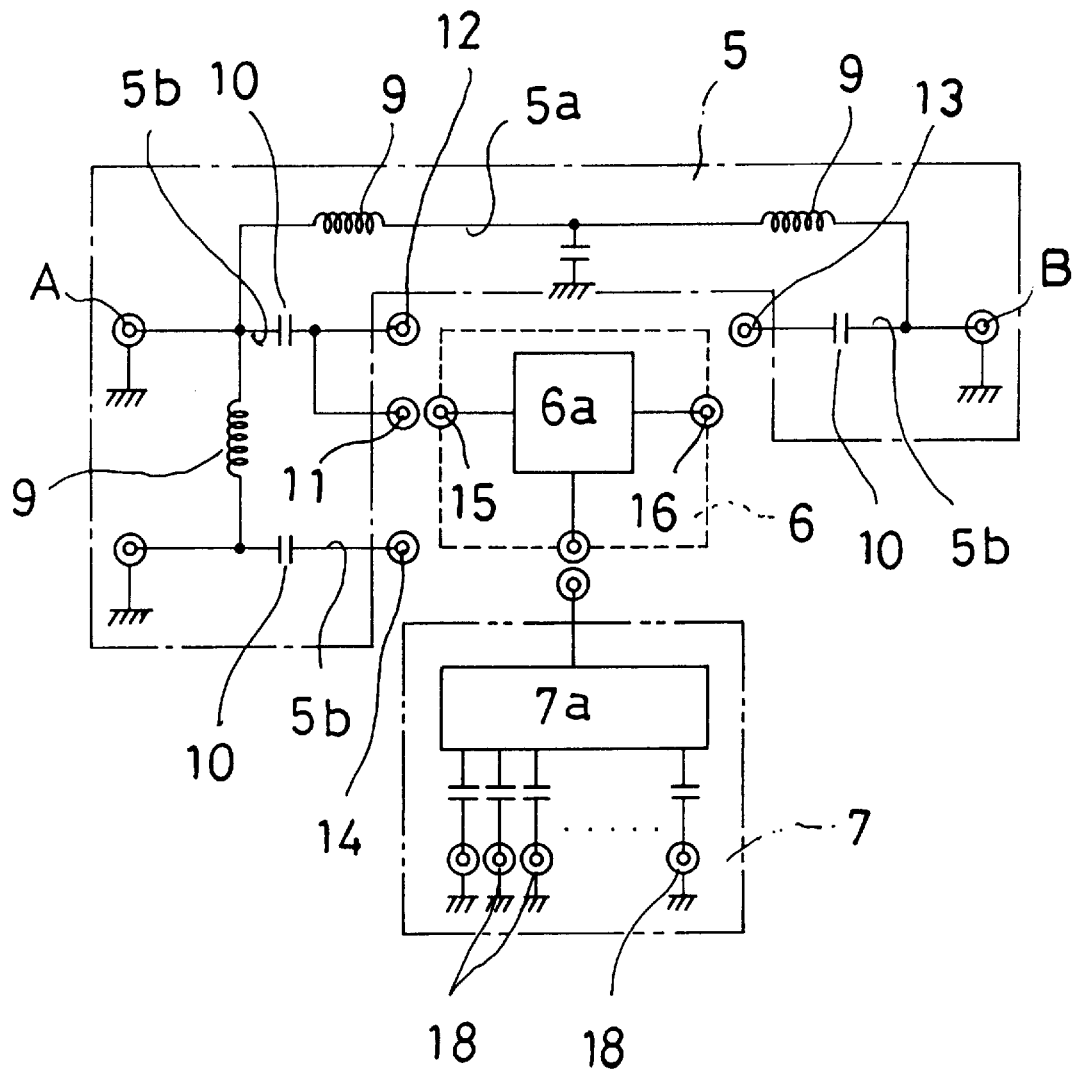
FIG. 2 is an illustrative diagram of a circuit of the direction coupler.

The mother board 5 is fixed to the cover body 1. The mother board 5 has a current passing circuit 5a that is provided with coils 9, 9, 9 as shown in FIG. 2, thereby allowing passage of current between the terminals A, B, C.

Relay circuits 5b, 5b, 5b having capacitors 10, 10, 10 connect relay terminals 11, 12 to the first terminal A, and relay terminals 13 and 14 to the second and third terminals B and C, respectively, so that a high frequency signal can be transmitted.

The first, second and third terminal-connecting portions are designed so that the cores of coaxial cables can be screwed thereto when the cables are inserted through the cable insert holes 2, 3, 4, respectively.

The branch unit 6 contains a branching circuit 6a, and has an input terminal 15 and an output terminal 16.

The branch unit 6 is mounted so that the branch unit 6 can be rotated relative to the mother board 5, with a central portion of the branch unit 6 being a fulcrum. The pair of the relay terminals 11, 13 and the pair of the relay terminals 12, 14 correspond to the input terminal 15 and the output terminal 16 of the branch unit 6, respectively.

A branch terminal 17 is provided at the rotation fulcrum. Fixation to the mother board 5 is made by screws 6b, 6b.

That tap plate 7 is fixed to the lid body 8 by screws 7b, 7b . . . . The tap plate 7 has a distributing circuit 7a and a plurality of distributing terminals 18, 18 . . . . The tap plate 7 has a connecting terminal 19 corresponding to the branch terminal 17.

The lid body B has connector seats 20, 20 . . . corresponding in number to the distributing terminals 18, 18 . . . .

Figure 3:
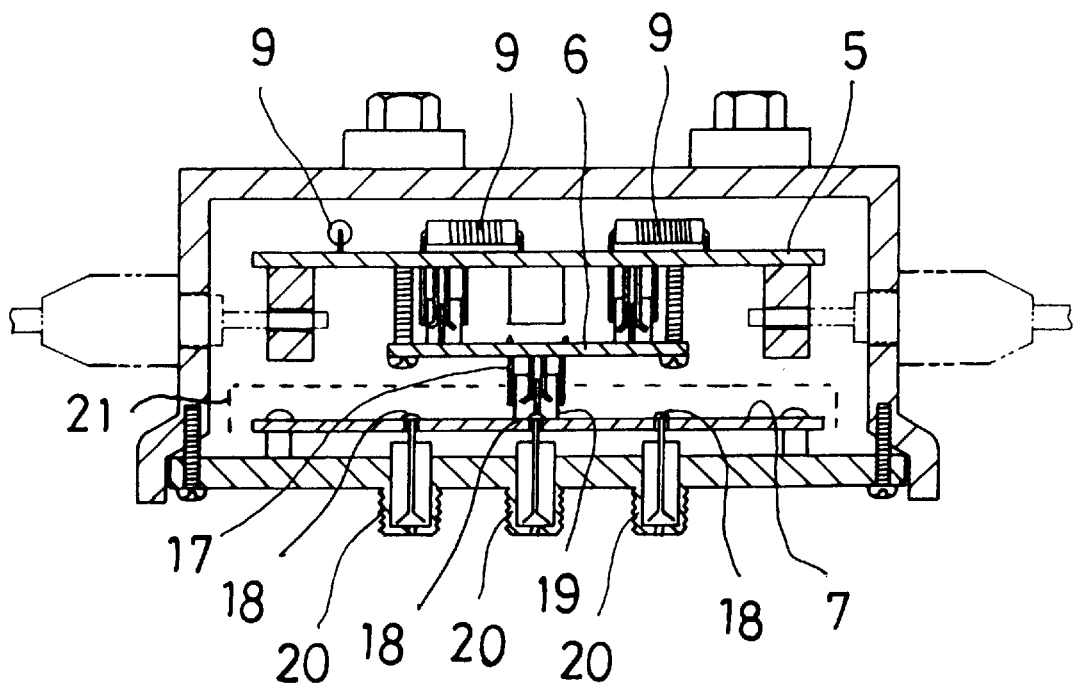
FIG. 3 is an illustrative diagram of an internal construction of the direction coupler.

A branch unit-side of the tap plate 7 is covered with a cover 21 fixed by screws 7c, 7c. The distributing terminals 18, 18 . . . are connected to the connector seats 20, 20 . . . of the lid body 8 (FIG. 3).

Figure 4:
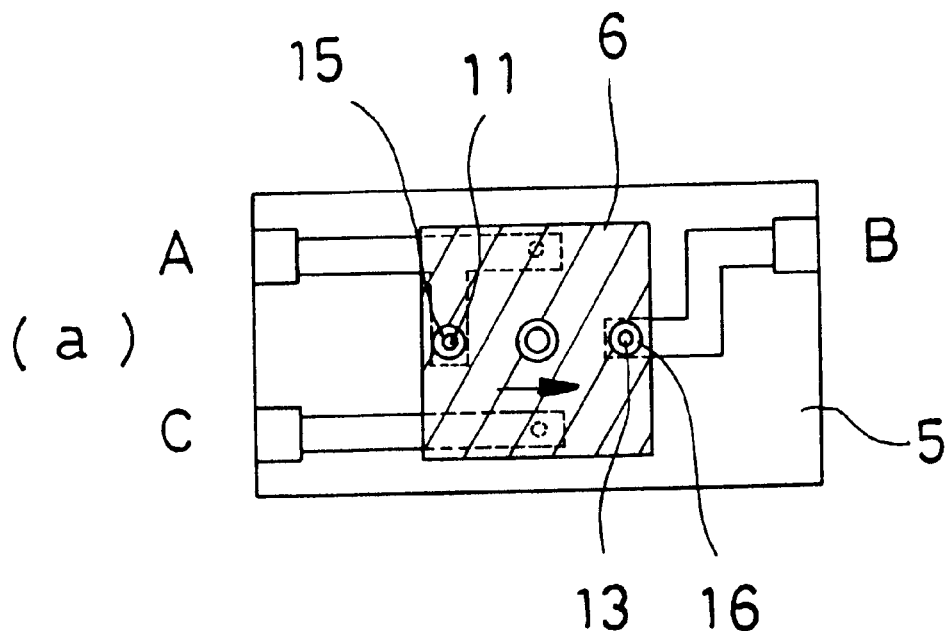
FIGS. 4a and 4b are diagrams illustrating an example of the operation of changing the terminals in position.
Figure 4:
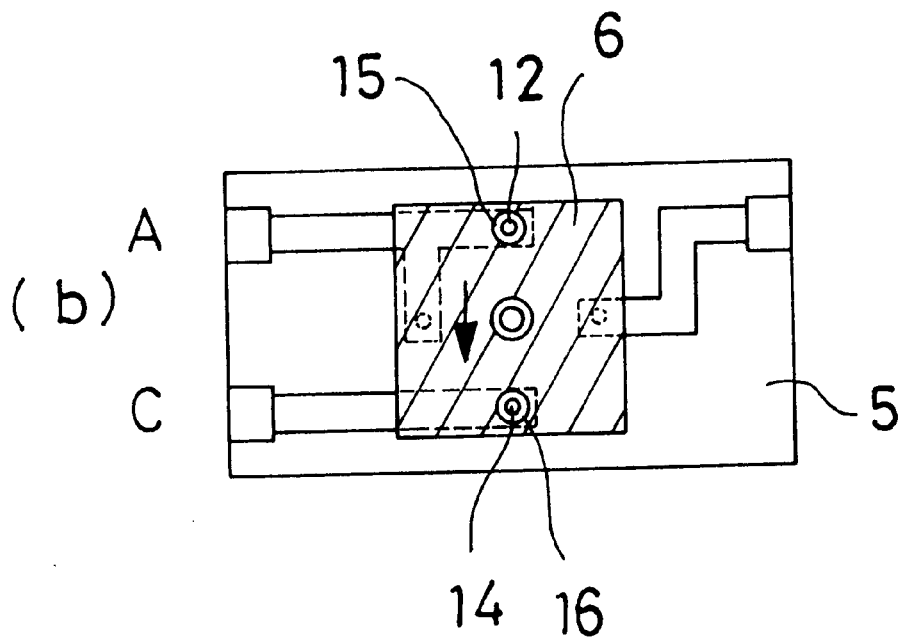

The thus-formed direction coupler can function as a suspended-type where the first terminal A serves as an input terminal and the second terminal B serves as an output terminal, if the input terminal 15 of the branch unit 6 is connected to the relay terminal 11 of the mother board 5 and the output terminal 16 is connected to the relay terminal 13 (FIG. 4a).

To increase the number of branches, the lid body 8 is removed, and the tap plate 7 and the branch unit 6 are taken out. In place of them, a lid body and a tap plate that match the desired number of branches, and a branch unit adapted to the desired amount of branching, are set in.

To change the direction coupler into a buried type, the branch unit 6 is rotated 90°. As a result, the input terminal 15 of the branch unit 6 is connected to the relay terminal 12 of the mother board 5 and, at the same time, the output terminal 16 is connected to the relay terminal 14. Thus, the first terminal A and the third terminal C are changed into an input terminal and an output terminal, respectively (FIG. 4b).

Another 90° rotation changes the first terminal A into an output terminal and the second terminal B into an input terminal. A further 90° rotation therefrom changes the first terminal A into an output terminal and the third terminal C into an input terminal.

As described above, since the changing operation merely requires removal and rotation, the operability is excellent. Furthermore, the current passing circuit 5a, the branching circuit 6a and the distributing circuit 7a are formed in separate units, that is, the mother board 5, the branch unit 6 and the tap plate 7, respectively. Further, the mother board 5 is fixed to the cover body 1, and the terminals are connected so as to allow current passage therebetween. Therefore, during a replacement operation, current passage is not interrupted, and the checking function is maintained. The changing operation can be completed merely by replacement of the individual units. The terminal change and the changing of the number of branches can be simultaneously performed.

The first, second and third terminal-connecting portions are not limited to a construction as in the embodiment wherein the cores of coaxial cables inserted through the cable insert holes are screwed to the mother board. The connections may also be established using connectors.

The arrangement of terminals does not need to be a combination of a side surface of the cover body and the opposite surface. A combination of neighboring side surfaces may also be selected for a terminal arrangement. The number of branches is not always increased but, in some cases, it is decreased. The number of branches in a tap plate may be any number. Current passing-type distributing terminals may also be employed. Thus, various modifications are possible.

In the embodiment, the branch unit is rotated to select relay terminals for connection. However, it is also possible to select relay terminals by changing the mounting position of a branch unit by, for example, sliding or moving the branch unit.

In such a case, the relay terminals are disposed at positions corresponding to the mounting manners of the branch unit.

According to the present invention, it becomes possible to change the positions of input/output terminals and, at the same time, increase the number of branch terminals and change the direction of transmission, as well.

What is claimed is:

1. A direction coupler wherein a mother board having a current passing circuit, a branch unit having a branching circuit and a tap plate having a distributing circuit are housed in a cover body in which connecting portions for first and second terminals are provided in a side surface thereof and a connecting portion for a third terminal is provided in another surface thereof, and wherein the branch unit has input/output terminals, and is mounted so that the mounting manner of the branch unit can be selected from a plurality of mounting manners relative to the mother board, and wherein the mother board is provided with relay terminals which are connected at positions that match position patterns of the input/output terminals corresponding to the individual mounting manners of the branch unit, so that high frequency signals can be transmitted through two terminals of said first, second and third terminals;

the branching circuit is supported to the mother board so that the branching circuit can be rotated along a surface of the mother board, with a central portion of the branching circuit as a fulcrum; and a branch terminal of the branch unit is provided at a position of a center of the rotation.

* * * * *